United States Patent
Bunce et al.

(10) Patent No.: US 10,320,388 B2
(45) Date of Patent: Jun. 11, 2019

(54) DYNAMIC DECODE CIRCUIT WITH ACTIVE GLITCH CONTROL METHOD

(71) Applicant: International Business Machines Corporation, Armonk, NY (US)

(72) Inventors: Paul Alan Bunce, Poughkeepsie, NY (US); Yuen Hung Chan, Poughkeepsie, NY (US); John D Davis, Maybrook, NY (US); Antonio Raffaele Pelella, High Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/029,603

(22) Filed: Jul. 8, 2018

(65) Prior Publication Data

US 2018/0316354 A1    Nov. 1, 2018

Related U.S. Application Data

(60) Continuation of application No. 15/796,819, filed on Oct. 29, 2017, which is a continuation of application No. 15/613,185, filed on Jun. 3, 2017, now Pat. No. 9,966,958, which is a division of application No. 15/274,322, filed on Sep. 23, 2016, now Pat. No. 9,742,408.

(51) Int. Cl.
   *H03K 19/096*    (2006.01)
   *G11C 8/18*      (2006.01)
   *G11C 8/10*      (2006.01)

(52) U.S. Cl.
   CPC .......... *H03K 19/0963* (2013.01); *G11C 8/10* (2013.01); *G11C 8/18* (2013.01)

(58) Field of Classification Search
   None
   See application file for complete search history.

(56) References Cited

U.S. PATENT DOCUMENTS

| 4,086,500 A | 4/1978 | Suzuki et al. |
| 5,263,173 A | 11/1993 | Gleason |
| 5,291,076 A * | 3/1994 | Bridges ..................... G06F 7/02 326/52 |

(Continued)

FOREIGN PATENT DOCUMENTS

EP    1887699 A2    2/2008

OTHER PUBLICATIONS

Preliminary Amendment Title "List of IBM Patents or Applications Treated as Related-III" 2 pages Filed Aug. 21, 2018.

(Continued)

*Primary Examiner* — Minh D A
*Assistant Examiner* — James H Cho
(74) *Attorney, Agent, or Firm* — John E. Campbell; Margaret A. McNamara

(57) ABSTRACT

A method for decoding a plurality of input signals in a plurality of dynamic decode circuits, each dynamic decode circuit sharing a conditioned node and comprising a decoder that decodes the plurality of input signals to produce a result at a first node, the result is propagated to second node while an evaluation clock is active by a pair of serially connected transistors consisting of a transistor receiving an evaluation clock at its gate and a transistor receiving the first node at its gate.

19 Claims, 9 Drawing Sheets

(56) References Cited

U.S. PATENT DOCUMENTS

| | | | |
|---|---|---|---|
| 5,737,279 A | 4/1998 | Oppold et al. | |
| 5,764,589 A * | 6/1998 | Lotfi | G11C 8/10 365/230.01 |
| 5,825,208 A | 10/1998 | Levy et al. | |
| 6,002,292 A | 12/1999 | Allen et al. | |
| 6,172,531 B1 | 1/2001 | Alpperspach | |
| 6,265,899 B1 | 7/2001 | Abdel-Hafeez et al. | |
| 6,331,791 B1 | 12/2001 | Huang | |
| 6,345,381 B1 | 2/2002 | Leight et al. | |
| 6,407,585 B1 | 2/2002 | Vinh | |
| 6,367,065 B1 * | 4/2002 | Leight | G06F 1/08 716/104 |
| 6,377,080 B1 | 4/2002 | Arnold | |
| 6,614,268 B2 | 9/2003 | Dally et al. | |
| 6,621,305 B2 | 9/2003 | Nakagawa et al. | |
| 6,911,846 B1 | 6/2005 | Blomgren et al. | |
| 7,034,576 B2 | 4/2006 | Levy et al. | |
| 7,109,757 B2 | 9/2006 | Yuan et al. | |
| 7,126,408 B2 | 10/2006 | Zerbe et al. | |
| 7,164,302 B1 | 1/2007 | Elkin | |
| 7,176,725 B2 | 2/2007 | Dawson et al. | |
| 7,332,937 B2 | 2/2008 | Hsu et al. | |
| 7,349,288 B1 | 3/2008 | Montoya et al. | |
| 7,372,303 B2 | 5/2008 | Akiyoshi | |
| 7,429,880 B2 * | 9/2008 | Rana | H03K 19/096 326/112 |
| 7,541,841 B2 | 6/2009 | Sumita | |
| 7,639,057 B1 | 12/2009 | Su | |
| 7,639,545 B2 | 12/2009 | Morein | |
| 7,683,672 B2 | 3/2010 | Bartlett | |
| 7,902,878 B2 | 3/2011 | Saint-Laurent et al. | |
| 7,936,185 B1 | 5/2011 | Weigl | |
| 7,940,087 B1 | 5/2011 | Weigl | |
| 8,063,673 B2 | 11/2011 | Masleid | |
| 8,072,252 B2 | 12/2011 | Bailey | |
| 8,164,972 B1 | 4/2012 | Su | |
| 8,339,884 B2 | 12/2012 | Huang et al. | |
| 8,487,657 B1 | 7/2013 | Hoekstra et al. | |
| 8,493,093 B1 * | 7/2013 | Chang | H03K 19/0963 326/93 |
| 8,552,761 B2 | 10/2013 | Kim | |
| 8,860,463 B1 | 10/2014 | Qureshi et al. | |
| 8,860,464 B2 | 10/2014 | Gupta et al. | |
| 8,861,302 B2 | 10/2014 | Terzioglu et al. | |
| 8,890,573 B2 | 11/2014 | Elkin et al. | |
| 8,946,877 B2 | 2/2015 | Snyder et al. | |
| 8,958,264 B2 | 2/2015 | Koike et al. | |
| 9,036,447 B2 | 5/2015 | Masleid et al. | |
| 9,742,408 B1 | 8/2017 | Bunce et al. | |
| 9,876,503 B2 | 1/2018 | Vrudhula et al. | |
| 9,966,958 B2 | 5/2018 | Bunce et al. | |
| 2005/0040861 A1 | 2/2005 | Haase | |
| 2005/0110522 A1 | 5/2005 | Hoekstra | |
| 2006/0082388 A1 | 4/2006 | Bjorksten et al. | |
| 2006/0176081 A1 | 8/2006 | Dawson et al. | |
| 2006/0176757 A1 | 8/2006 | Chan et al. | |
| 2006/0290383 A1 | 12/2006 | Chuang et al. | |
| 2006/0290384 A1 | 12/2006 | Chuang et al. | |
| 2007/0176641 A1 | 8/2007 | Kursun et al. | |
| 2007/0176642 A1 | 8/2007 | Kursun et al. | |
| 2008/0084235 A1 | 4/2008 | Russell et al. | |
| 2008/0143412 A1 | 6/2008 | Sumita | |
| 2008/0258788 A1 | 10/2008 | Bhatia et al. | |
| 2009/0230994 A1 | 9/2009 | Rhee et al. | |
| 2012/0146697 A1 | 6/2012 | Leach et al. | |
| 2012/0182056 A1 | 7/2012 | Dally | |
| 2015/0091629 A1 | 4/2015 | Ishizu et al. | |
| 2016/0307621 A1 | 10/2016 | Campbell et al. | |
| 2018/0091153 A1 | 3/2018 | Bunce et al. | |

OTHER PUBLICATIONS

U.S. Appl. No. 16/029,607 Title "Dynamic Decode Circuit With Delayed Precharge" filed Jul. 8, 2018. Paul Alan Bunce et al. all pages.

U.S. Appl. No. 16/029,577 Title "Dynamic Decode Circuit With Active Glitch Control" filed Jul. 8, 2018. all pages.

U.S. Appl. No. 16/101,488 Title: "Dynamic Decode Circuit With Active Glitch Control" filed Oct. 29, 2017, Antonio Rafaelle Pelella; All pages.

U.S. Appl. No. 16/029,603 Title "A Dynamic Decode Circuit With Active Glitch Control Method" filed Jul. 8, 2018. Paul Alan Bunce et al. all pages.

U.S. Appl. No. 16/029,577 Title "Dynamic Decode Circuit With Active Glitch Control" filed Jul. 8, 2018. Paul Alan Bunce et al. all pages.

Turi et al.; "Low-Power FinFET Design Schemes for NOR Address Decoders", VLSI Design Automation and Test (VLSI-DAT), 2010 IEEE International Conference on, Apr. 26-19, 2010, pp. 74-77.

Thorp et al.; "Analysis of Blocking Dynamic Circuits", Very Large Scale Integration (VLSI) Systems, IEEE Transactions on, vol. 11, Issue 4, Aug. 2003, pp. 744-748.

Mane et al.; "Stateful-NOR Based Reconfigurable Architecture for Logic Implementation", Microelectronics Journal, vol. 46, Issue 6, Jun. 2015, pp. 551-562.

* cited by examiner

DYNAMIC DECODE CIRCUIT WITH ACTIVE GLITCH CONTROL METHOD

FIELD OF THE INVENTION

The present invention is related to computer systems and more particularly to controlling glitches in a decode circuit implemented in dynamic logic.

BACKGROUND

SRAM (static Random Access Memory) can be limited by the performance of its address decoders. In certain SRAM designs, as soon as a particular row of cells may be selected by the corresponding word line going high, the bit lines begin to develop a voltage based on the contents of the memory cells. The sooner the word line goes high, the better the read performance of the SRAM. Hence, speed up in the operation of the address decoders results in a better performance of the memory array.

CMOS logic may be often implemented in dynamic logic where circuits may be precharged in a precharge phase of clocking, and evaluated in an evaluate stage of the clocking.

Dynamic decode circuits may be synchronous logic circuits that generate an output depending upon a predetermined combination of inputs. Precharge devices may be characterized by two states, precharge and evaluate. In the precharge state, a node may be charged to a known or predetermined voltage level, for example high (near VDD). In the evaluate state, an array or "tree" of transistors may be given the opportunity to either discharge the node to a second known or predetermined voltage level, for example low (near VSS) or to allow the charge to persist. Each input signal may be connected, typically, to a gate of one or more of the transistors in the tree. The final charge on the output node may thereby be controlled by the particular values of the inputs and the way in which the transistors may be connected within the tree. The final voltage at the node, high or low, acts as the output of the dynamic decode circuits after being suitably buffered and, perhaps, inverted. The two states of a precharge device each correspond to one of the two logic states of a clock signal cycle to which the precharge device may be synchronized. Typically, a pfet precharge device precharges the node when the clock is low and evaluates the node when the clock is high.

Two common uses for precharge devices may be as decoders and as comparators. Decoders output a unique signal if and only if all of the bits of an input match a predetermined set of values. A decoder may thereby enable a particular write line in a matrix of memory cells if and only if an input memory address matches the predetermined address of a line of memory cells to which the decoder may be connected. Similarly, a comparator will output a unique signal if and only if two inputs, each containing multiple data bits, may be identical.

The particular way the inputs may be combined within the tree of a dynamic decode circuit determines the particular operating characteristics (function) and, hence, the particular name of the node. As described above, if the tree discharges the charged node if and only if the input bits match a single set of predetermined values, then the a dynamic decode circuit may be a decoder. Any Boolean function can be implemented as a dynamic decode circuit by constructing the tree such that the tree causes the precharge device to discharge when the Boolean function may be either true or false, as needed by the designer. Logically, it may be irrelevant whether a tree allows the charge in a dynamic decode circuit to persist when the Boolean function is true or to persist when the function is false.

Each dynamic decode circuit can be implemented in one of two logically equivalent ways. The two implementations correspond to a tree that discharges the charged node when the Boolean function is true and to a tree that discharges the charged node when the Boolean function is false. When a dynamic decode circuit discharges the node if the Boolean function is true, it may be said to "evaluate to the active state." When the precharge device discharges the node if the Boolean function may be false, it may be said to "evaluate to the inactive state." One of these implementations uses its inputs directly connected in a manner to describe a particular function. The second implementation uses the complements of the inputs and a second function. DeMorgan's law allows the designer to restructure the tree of the first function to produce a tree for the second function. The second function may be the first function's complement.

Although logically equivalent, each of the two possible implementations of a dynamic decode circuit has its own disadvantage. Specifically, the more transistors connected in series within the tree, the slower the performance of the dynamic decode circuit. This disadvantage may be typically associated with a dynamic decode circuit that discharges the charged node when its function is true. Conversely, a dynamic decode circuit that evaluates to the inactive state generates an output unacceptable to many types of circuits. This disadvantage may be typically associated with a dynamic decode circuit that discharges the charged node when its function is false.

SUMMARY

The shortcomings of the prior art may be overcome and additional advantages may be provided through the provision of a dynamic decode circuit. The dynamic decode circuit comprises a decoder to decode a set of inputs to produce a true or false indication. The dynamic decode circuit is optionally configured to precharge clock transistors or evaluate clock transistors, such that a combination of N dynamic decode circuits each implement transistors 1/Nth the size of prior art dynamic decode circuits. The dynamic decode circuit optionally has a delayed precharge function to begin precharge of circuits a predetermined time after the end of the evaluate period, thus reducing possibility of unwanted glitches. The dynamic decode circuit optionally precharges the output of an evaluate transistor.

In an embodiment, a dynamic decode circuit for decoding a plurality of input signals is provided, the dynamic decode circuit comprising: a decoder comprising a plurality of decode transistors, the decode transistors configured to cause a first node to be in a first state based on the input signals being in a first input signal state and an evaluation clock signal being active; the decode transistors configured to cause the first node to be in a second state based on the input signals being in a second input signal state other than the first input signal state and the evaluation clock signal being active; an evaluate clock circuit conductively connected between a first power source and a second node, the evaluate clock circuit consisting of a first transistor and a second transistor, the first transistor serially connected by a first interconnecting node to the second transistor, the first transistor comprising a first gate configured to receive the evaluation clock signal, the first transistor configured to conduct based on the evaluation clock signal being active, the second transistor comprising a second gate conductively connected to the first node, the first transistor configured to not conduct based on the evaluation clock signal being inactive; and one or more precharge circuits conductively connected to a second power source, the precharge circuits configured to precharge the first node and the second node and the first interconnecting node based on the evaluation clock signal being inactive, the precharge circuits configured to not conduct based on the evaluation clock signal being active.

In an embodiment, at least one of the precharge circuits is a delay precharge circuit, the delay precharge circuit configured to delay start of precharge by a predetermined delay following the evaluation clock becoming inactive.

In an embodiment, the precharge circuit configured to precharge the first interconnecting node is a delay precharge circuit.

In an embodiment, the delay precharge circuit consists of a third transistor serially connected by a second connection to a fourth transistor, the third transistor having a third gate configured to receive the evaluation clock signal, the fourth transistor having a fourth gate configured to receive a delay clock signal the delay clock signal being a delayed version of the evaluation clock signal.

In an embodiment, the dynamic decode circuit further comprises a serially connected plurality of fifth transistors, the plurality of fifth transistors disposed between the second power source and the first node, the plurality of fifth transistors each configured to receive a respective one of the plurality of input signals, the plurality of fifth transistors configured to keep the first node in the recharge state based on the input signals being in the first state.

In an embodiment, the dynamic decode circuit further comprises: a sixth transistor coupled between the second node and the second power source, the sixth transistor comprising a sixth gate coupled to the first node, the sixth transistor configured to keep the second node in the precharge state based on the first node being in the state other than the precharge state.

In an embodiment, the plurality of decode transistors are conductively connected in parallel with one another.

In an embodiment, the decoder further comprises a third node, the third node interconnecting the plurality of decode transistors to a clocking transistor, the clocking transistor conductively connected to the first power source, the clocking transistor having a clocking gate configured to receive the evaluation clock signal.

In an embodiment, the clocking transistor is the first transistor, and the third node is conductively connected to the first interconnecting node.

In an embodiment, the precharge circuits configured to precharge the first node and the second node and first interconnecting node are delay precharge circuits, each delay precharge circuit consisting of a third transistor serially connected by a second connection to a fourth transistor, the third transistor having a third gate configured to receive the evaluation clock signal, the fourth transistor having a fourth gate configured to receive a delay clock signal, the delay clock signal being a delayed version of the evaluation clock signal.

In an embodiment, the one or more precharge circuits comprise a first precharge circuit and a second precharge circuit, the first precharge circuit configured to precharge the first node consisting of a sixth transistor and the second precharge circuit configured to precharge the second node consisting of a seventh transistor, the sixth transistor having a sixth gate configured to receive the evaluation clock signal, and the seventh transistor having a seventh gate configured to receive the evaluation clock signal.

In an embodiment, the fourth transistor of the dynamic decode circuit is conductively connected by the second interconnection to fourth transistors of a plurality of other dynamic decode circuits, whereby all fourth transistors of all dynamic decode circuits are conductively connected in parallel between the second power source and the second interconnection.

In an embodiment, the first transistor of the dynamic decode circuit is conductively connected by the first interconnection to first transistors of a plurality of other dynamic decode circuits, whereby all first transistors of all dynamic decode circuits are conductively connected in parallel between the first power source and the first interconnection.

In an embodiment, a dynamic decode circuit is provided comprising: an evaluation clock circuit comprising a pair of nfet transistors consisting of a first nfet transistor serially connected at a first interconnection node to a second nfet transistor, the first nfet transistor having a gate configured to receive an evaluation clock signal, the second nfet transistor having a gate conductively connected to a first node, the pair of nfet transistors conductively connected between a first power source and a second node; a decode circuit comprising a plurality of third nfet transistors conductively connected in parallel between the first node and a third node, each third nfet transistor having a gate configured to receive a respective input signal of a plurality of input signals, the third node conductively connected to the first power source through a fourth nfet transistor, the fourth nfet transistor having a gate configured to receive the evaluation clock signal, the third nfet transistors configured to cause the first node to transition to a result value based on state of the plurality of input signals and based on the evaluation clock signal being high; a precharge circuit consisting of a pair of pfet transistors consisting of a fifth pfet transistor serially connected at a second interconnection node to a sixth pfet transistor, the fifth pfet transistor having a gate configured to receive a delayed evaluation clock signal, the sixth pfet transistor having a gate configured to receive the evaluation clock signal, the pair of pfet transistors disposed between a second power source and the first interconnection node, the pair of pfet transistors configured to cause the first interconnection node to be precharged high based on both the delayed evaluation signal being low and the evaluation clock signal being low; and a keeper circuit comprising a seventh pfet transistor conductively connected between the second power source and the second node, the seventh pfet transistor having a gate conductively connected to the first node, the seventh pfet transistor configured to keep the second node high based on the first node being low.

In an embodiment, a plurality of dynamic decode circuits is provided, each dynamic decode circuit comprising a decoder configured to decode a corresponding plurality of input signals, each dynamic decode circuit further comprising a conditioning transistor configured to condition a conditioned node of the dynamic decode circuit, the conditioning transistor having a gate conductively connected to a clock signal, the conditioning transistor conductively connected between the conditioned node and a power source, each conditioning transistor of each dynamic decode circuit conductively connected in parallel between the power source and interconnected conditioned nodes of the plurality of dynamic decode circuits.

In an embodiment, the conditioning transistor comprises a first precharge pfet transistor configured to precharge the conditioned node of the dynamic decode circuit, the plurality of dynamic decode circuits sharing drains of respective first precharge pfet transistors.

In an embodiment, the conditioning transistor consists of an nfet evaluate transistor configured to evaluate function of the dynamic decode circuit, the plurality of dynamic decode circuits sharing drains of respective evaluate transistors.

In an embodiment, the conditioning transistor comprises two serially connected transistors consisting of the first precharge pfet transistor having a first gate configured to receive an evaluation clock signal and a second precharge pfet transistor having a second gate configured to receive a delayed evaluation clock signal.

In an embodiment, the plurality of dynamic decode circuits are configured, based on the state of the input signals, to enable a decoder of only a predetermined maximum number of dynamic decode circuits of the plurality of dynamic decode circuits to conduct in any clock cycle, wherein size of the conditioning transistor is determined by a ratio of the predetermined maximum number to a total number of dynamic decode circuits.

In an embodiment, the predetermined maximum number is one.

Additional features and advantages may be realized through the techniques of the present invention. Other embodiments and aspects of the invention may be described in detail herein and may be considered a part of the claimed invention. For a better understanding of the invention with advantages and features, refer to the description and to the drawings.

BRIEF DESCRIPTION OF THE DRAWINGS

The subject matter which may be regarded as the invention may be particularly pointed out and distinctly claimed in the claims at the conclusion of the specification. The foregoing and other objects, features, and advantages of the invention may be apparent from the following detailed description taken in conjunction with the accompanying drawings in which:

Figure 1:
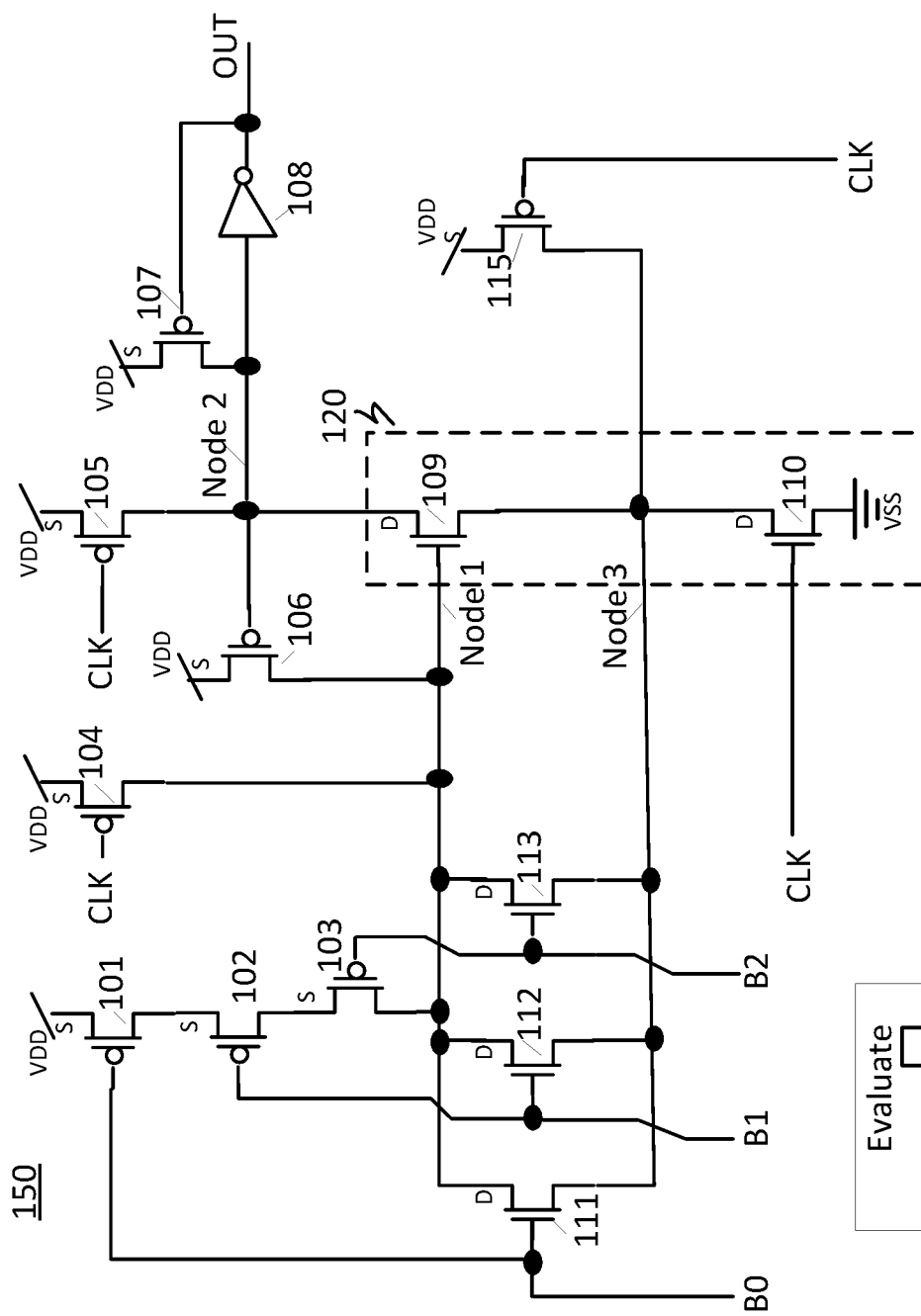
FIG. 1 depicts an example embodiment of a dynamic decode circuit.

The detailed description explains the preferred embodiments of the invention, together with advantages and features, by way of example with reference to the drawings.

DETAILED DESCRIPTION OF EMBODIMENTS

Glossary of Terms

In dynamic logic, a problem arises when cascading one gate to the next. The precharge "1," state of the first gate may cause the second gate to discharge prematurely, before the first gate has reached its correct state. This uses up the "precharge" of the second gate, which cannot be restored until the next clock cycle, so there may be no recovery from this error.

In order to cascade dynamic logic gates, one solution may be Domino Logic, which inserts an ordinary static inverter between stages. While this might seem to defeat the point of dynamic logic, since the inverter has a pfet (one of the main goals of Dynamic Logic may be to avoid pfets where possible, due to speed), there may be two reasons it works well. First, there may be no fan-out to multiple pfets; the dynamic gate connects to exactly one inverter, so the gate may be still very fast. Furthermore, since the inverter connects to only nfets in dynamic logic gates, it too may be very fast. Second, the pfet in an inverter can be made smaller than in some types of logic gates.

In Domino logic cascade structure of several stages, the evaluation of each stage ripples the next stage evaluation, similar to a domino falling one after the other. Once fallen, the node states cannot return to "1" (until the next clock cycle) just as dominos, once fallen, cannot stand up, justifying the name Domino CMOS Logic. It contrasts with other solutions to the cascade problem in which cascading may be interrupted by clocks or other means.

Bulk-CMOS refers to Complementary Metal Oxide Semiconductor and refers to a design and fabrication technology for semiconductors.

SOI (Silicon On Insulator) where Insulator may be Oxide or nitride of Silicon and the like or Sapphire. The SOI field effect transistor n-type (nfet) has a parallel parasitic bipolar NPN transistor associated with it. The drain of the n-type may be equivalent to the collector of the parasitic bipolar transistor. The source of the n-type may be equivalent to the emitter of the parasitic bipolar transistor. The body of the n-type becomes charged by induced leakage whenever the drain and source terminals may be held at a high potential. If the source may be dropped to a low potential the trapped charge in the body causes a current to flow from the base of the parasitic bipolar transistor. This causes a current to flow in the collector that may be parallel to a current flowing in the drain. This action may discharge the drain node of a dynamic circuit and may result in erroneous evaluation. The SOI device may be strained by introducing another material with different atomic size than Silicon e.g. Germanium and the like.

A Metal Oxide Semiconductor (MOS) transistor has two electrodes referred to as the source and the drain and a control electrode as the gate. A transistor has a bulk connection which may be floating e.g. in SOI.

N-type (nfet) may be a Metal Oxide Semiconductor (MOS) transistor with electrons as majority carriers.

P-type (pfet) may be a Metal Oxide Semiconductor (MOS) transistor with holes as majority carriers Primitives may be technology independent logic gates e.g. AND gates, OR gates, NOT etc.

NAND logic gate may be inversion of AND and NOR logic gate may be inversion of OR.

.lib is the Synopsys library format.

Digital design Synthesis may be used to mean the synthesis is of a technology dependent model from a register transfer level description or from interconnected functional blocks to result in standard-cell mapped design from a target library, or result in a combination of standard-cell mapped design from a target library and a transistor level representation for part or all of the input design specification.

Under DeMorgan's theorem, a NAND gate with inverted inputs performs an OR function and a NOR gate with inverted inputs performs an AND function.

A short-circuit occurs when there is a path of zero or almost zero resistance between a first known voltage level and a second known voltage level.

A non-inverting node has no inversion e.g. AND, OR and the like or a combination of these.

An inverting node has inversion e.g. NAND, NOR, NOT and the like or a combination of these.

As used herein, VDD voltage level may be referred to as "high" or "positive", and a VSS voltage level may be referred to as "low" or "negative". A logical "1" may be referred to as "high" or "positive" and a logical "0" may be referred to as "low" or "negative". Pfet transistors conduct when the pfet transistor gate is low and nfet transistors conduct when the nfet transistor gate is high. Low power pfet transistors may be used as "keeper" circuits to hold a node high. These pfet transistors may be too weak to keep a node high if a stronger nfet transistor conducts in series with the pfet, so the nfet will overcome the pfet and pull the node low. However, the keeper circuits may keep the node high if there is only a brief glitch on the node.

Dynamic decode circuits 150 250 350 are characterized as circuits that decode input signals B0 B1 B2 to produce an active output value OUT based on the input signals having a predetermined value. Certain internal nodes Node 1 Node 2 and the output OUT are set to an initial value during the precharge phase of the dynamic decode circuit clock CLK, In the example, the dynamic decode circuit is a domino circuit characterized by the inverter 108 resulting in the output OUT being low during the precharge phase (CLK low). Only when the input signals have the predetermined value (all low) during the evaluate phase (CLK high) in the example, will the output value OUT transition to the active value (high).

Embodiments are provided that improve size, performance and stability of dynamic decode circuits over prior art embodiments. In one embodiment, Node 3 is precharged to introduce a delay to avoid glitches due to prior art quick transition of Node 3 relative to Node 1 as now Node 3 goes active (low) from VDD rather than a floating gate of prior art. The delay introduced non-intuitively, may improve performance of the dynamic decode circuit.

In one embodiment, a delay is introduced between the evaluate phase and the precharge phase which reduces glitches and enables the dynamic decode circuit to keep the output OUT signal active longer.

In this specification, elements included in Figures having the same numeric tag may have substantially the same function.

In an embodiment, nodes of a common dynamic decode circuit (NSHARE, PSHARE) are designed with much smaller clocked transistors, taking advantage of the fact that the dynamic decode circuit is provided in multiple modules of a design, and that only one decode function of all the modules will be selected in any evaluate cycle. Thus these transistors share the current requirement in parallel with each other amongst the multiple modules. This non-intuitive reduction in transistor size may improve performance of the overall implementation.

Referring to FIG. 1, an embodiment of a dynamic decode circuit 150 is shown.

In the embodiment, CLK signal 114 when high may be in an evaluating phase and when low may be in a precharging phase. In an embodiment, the CLK signal may be asymmetrical, i.e. high (active) only for 30% of the CLK signal period for example.

In the precharge phase the evaluation clock signal CLK may be low. The low CLK turns off nfet 110 and turns on pfets 104 105. In turn, pfet 104 precharges internal Node 1 high and pfet 105 precharges Node 2 high which forces output OUT low. During the precharge phase the inputs B0 B1 and B2 may change state but Node 1 will stay high. Due to the nature of dynamic logic, if any of the inputs B0 B1 B2 go positive momentarily in the evaluate stage, Node 1 may be pulled low and stay low independent of other input changes until the next precharge phase.

The evaluate phase occurs when the CLK signal goes high. This turns off the precharge transistors 104 105 and turns on the evaluate clock transistor 110. If any of the three inputs B0 B1 or B2 are high a path from internal Node 1 to VSS through 110 may be created and Node 1 may be pulled low. During the evaluation phase, with Node 1 low, nfet 109 turns off causing Node 2 to stay high and the output OUT stays low. If, however, all three inputs are low during the evaluation phase, Node 1 remains in the high state through the influence of keeper 106. Pfets may be sized to be much weaker than the nfets in the circuit so as to be easily overridden when a node is pulled low.

If any of the inputs B0 B1 B2 go positive momentarily in the evaluate stage, Node 1 will stay low independent of the inputs until the next precharge phase.

Three pfet series transistors 101 102 103 perform a keeper function on Node 1. They receive respective input signals B0 B1 and B2 and keep Node 1 positive after a glitch on Node 1 if all the inputs are low, independent of CLK.

The name domino comes from the analogy between a sequence of domino logic gates connected in series and a line of domino pieces stood on edge in a row. When the evaluate phase starts a high going output from the first stage can quickly propagate down the chain of dynamic logic discharging internal evaluation nodes like one domino piece knocking down the next piece in the row and so on.

Notice that during the evaluate phase, if Node 1 is pulled low that it will remain low until the next precharge phase. Therefore it may be important for all inputs to a dynamic gate to remain stable in their intended state while the evaluate signal CLK is high. That is in contrast to a static logic gate that imposes no restriction on when inputs may change state. Also notice that the output of a dynamic circuit will always go low during the precharge phase regardless of the state of the inputs.

That means a dynamic gate may undergo switching activity each clock cycle even if the inputs remain unchanged.

For all its complexity and constraints, the dynamic decode circuit in FIG. 1 has a number of advantages over its static cousins. First of all, the complementary network of pfets in a static CMOS logic gate has been replaced by a precharge pfet 104 105 and keeper pfet 106 107. The logic function of the gate may be entirely determined by the topology of the nfet pull down network 111 112 113 in the first stage of the domino circuit. This has a profound impact on performance since the complementary pfet network typically represents over half the circuit and roughly ⅔ of the non-interconnect related internal parasitic capacitance. In general, the higher the fan-in (number of inputs) of a logic function the greater the potential performance advantage of a dynamic circuit implementation.

Another advantage of dynamic logic may be that fast logic propagation occurs in only one direction—internal evaluation node falls while the stage output rises. The opposite transition occurs during the precharge phase in parallel across all logic stages and isn't as time critical. This means the transistor size ratios in dynamic circuits can be skewed to increase propagation speed for the active transition. For example, in a domino circuit the $W_P:W_N$ ratio in the output inverter may be as high as 6:1 in practice. In addition, the input voltage level that a dynamic logic stage switches may be typically lower than for a static logic gate.

This may be an advantage in reducing signal propagation times but may be also a disadvantage in that circuits may be much more vulnerable to induced noise on logic signals. Typical design practice may be for signals that travel a long distance (and thus may be more susceptible to noise and ground shift) to be cleaned up by passing through a latch 107 108 (for example) or static logic gate 108 before connecting to the input of another dynamic circuit.

A dynamic decode circuit FIG. 1 may perform the steps of precharging a first and a second node to a first known voltage at a first time and evaluating the voltage on the first node at a second time. The first node and a third node may be coupled to a transistor tree 111 112 113. The tree may be operable to electrically short-circuit the two nodes (Node 1 Node 3) responsive to input signals B0 B1 B2. The second node Node 2 may be coupled to a first current electrode of a screening transistor 109. The screening transistor also has a second current electrode and a control electrode. The control electrode of the screening transistor may be coupled to the first node and the second current electrode of the screening transistor may be coupled to the third node.

In the embodiment, CLK signal 114 when high may be in an evaluating phase and when low may be in a precharging phase. In an embodiment, the CLK signal may be asymmetrical, i.e. high (active) only for 30% of the CLK signal period for example.

The embodiment may include a special precharge circuit 115 for precharging an internal node between serially connected transistors 109 110 of an evaluation circuit 120. The evaluation circuit causing Node 2 to transition to the inverse of Node 1 when the evaluation clock CLK goes high. The special precharge circuit 115 is not intuitive since it would appear to introduce an unwanted delay in the dynamic decode circuit 150. However, advantages may outweigh the negatives, for example, in an implementation where a plurality of dynamic decode circuits are provided, the overall performance may improve.

In an embodiment, the evaluation clock CLK provided to the special precharge circuit 115 is the same evaluation CLK provided to the evaluation clock used by evaluation transistors nfet 110.

In an embodiment, the clock CLK provided to the special precharge circuit 115 may be a special evaluation clock SCLK different from the evaluation clock CLK used by evaluation transistors nfet 110 of the dynamic decode circuit. The SCLK may be a delayed version DCLK of the evaluation clock CLK. In an embodiment, the SCLK is high longer than the CLK is high, causing a delay in beginning precharge after the fall of CLK. In an embodiment, a precharge circuit 104 105 other than the special precharge circuit 115, may be provided with the special evaluation clock SCLK. In an embodiment, the circuit 150 employs a serial pair of clocking pfet transistors 218 217 to perform the precharge functions of the special precharge circuit 115. Preferably the precharge phase starts at a predetermined time after the end of the evaluation phase (CLK high). During the predetermined period, the result of the evaluation is maintained. The serial pair includes a respective CLK pfet transistor 218, and a respective DCLK pfet transistor 217. The DCLK may be a delayed version of the evaluation clock CLK. A DCLK signal applied to the DCLK pfet transistor causes the start of the precharge cycle to be delayed.

In the precharge phase the evaluation clock signal CLK may be low. The low CLK turns off nfet 110 and turns on pfets 104 105. In turn, pfet 104 precharges internal Node 1 high and pfet 105 precharges Node 2 high which forces output OUT low. During the precharge phase the inputs B0

B1 and B2 may change state but Node 1 will stay high. Due to the nature of dynamic logic, if any of the inputs B0 B1 B2 go positive momentarily in the evaluate stage, Node 1 may be pulled low and stay low independent of other input changes until the next precharge phase.

The evaluate phase occurs when the CLK signal goes high. This turns off the precharge transistors 104 105 and turns on the evaluate clock transistor 110. If any of the three inputs B0 B1 or B2 are high a path from internal Node 1 to VSS through 110 may be created and Node 1 may be pulled low. During the evaluation phase, with Node 1 low, nfet 109 turns off causing Node 2 to stay high and the output OUT stays low. If, however, all three inputs are low during the evaluation phase, Node 1 remains in the high state through the influence of keeper 106. Pfets may be sized to be much weaker than the nfets in the circuit so as to be easily overridden when a node is pulled low.

Figure 2:
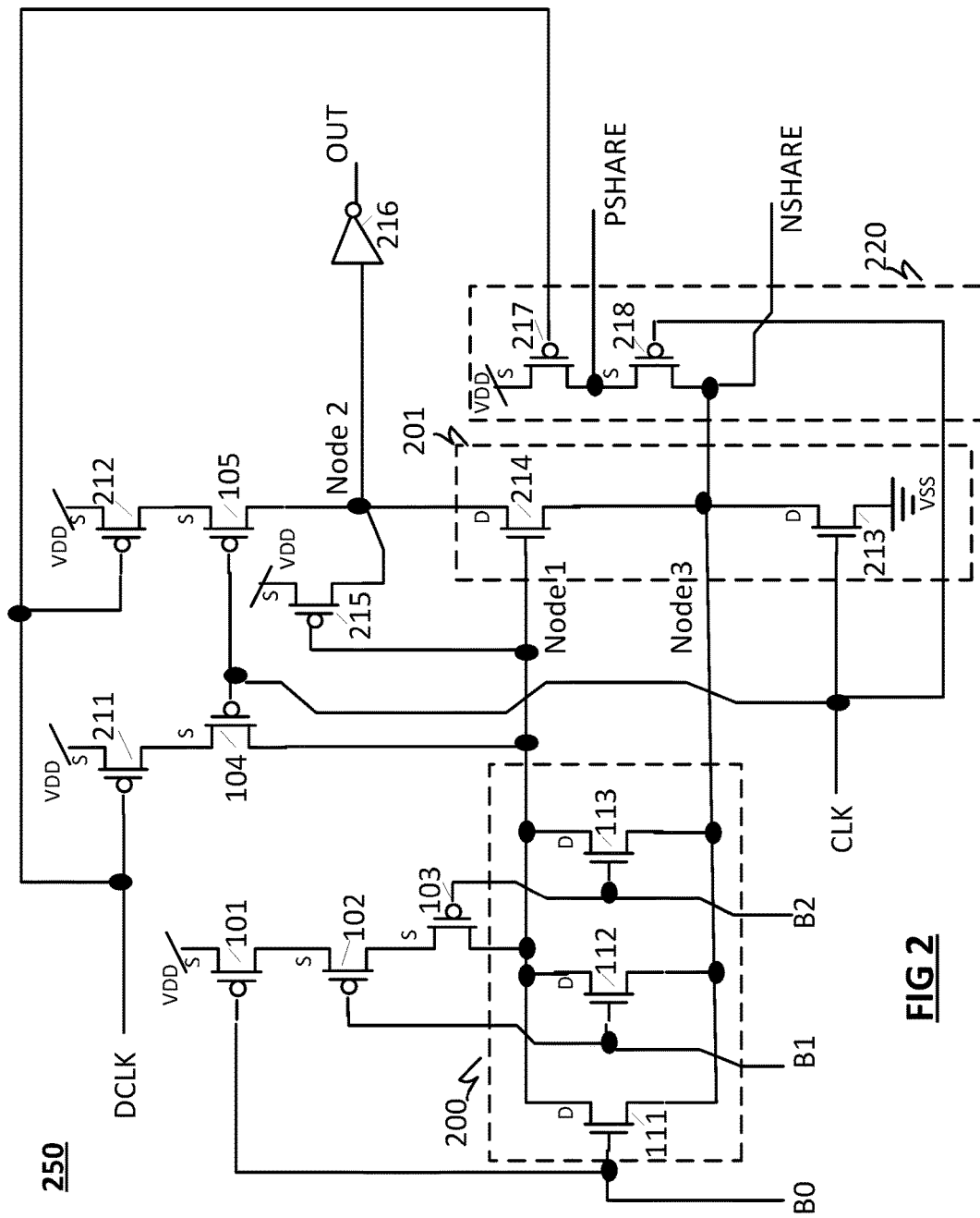
FIG. 2 depicts an example dynamic decode circuit with a DCLK clock.

Referring to FIG. 2, the circuit 250 employs serial pairs of clocking pfet transistors 104 211, 105 212 and 218 217 to perform the precharge functions. Preferably the precharge phase starts at a predetermined time after the end of the evaluation phase (CLK high). During the predetermined period, the result of the evaluation is maintained. Each serial pair includes a respective CLK pfet transistor 104 105 218, and a respective DCLK pfet transistor 211 212 and 217. A DCLK signal applied to the DCLK pfet transistor causes the start of the precharge cycle to be delayed.

Figure 10:
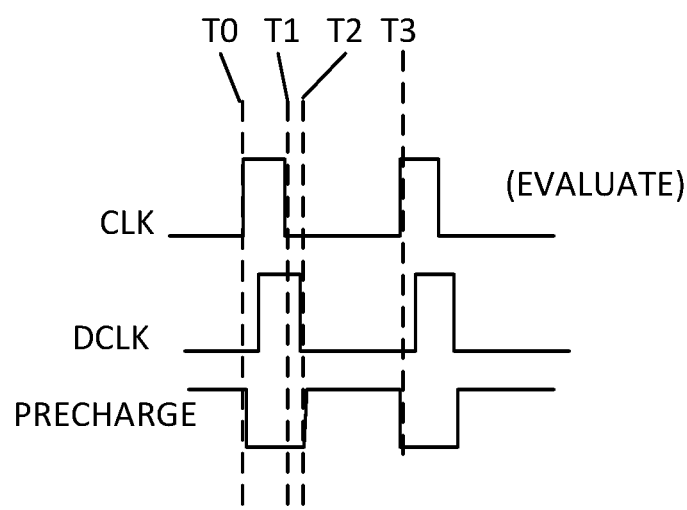
FIG. 10 depicts an example timing relationship of Evaluate and Precharge.
Figure 11:
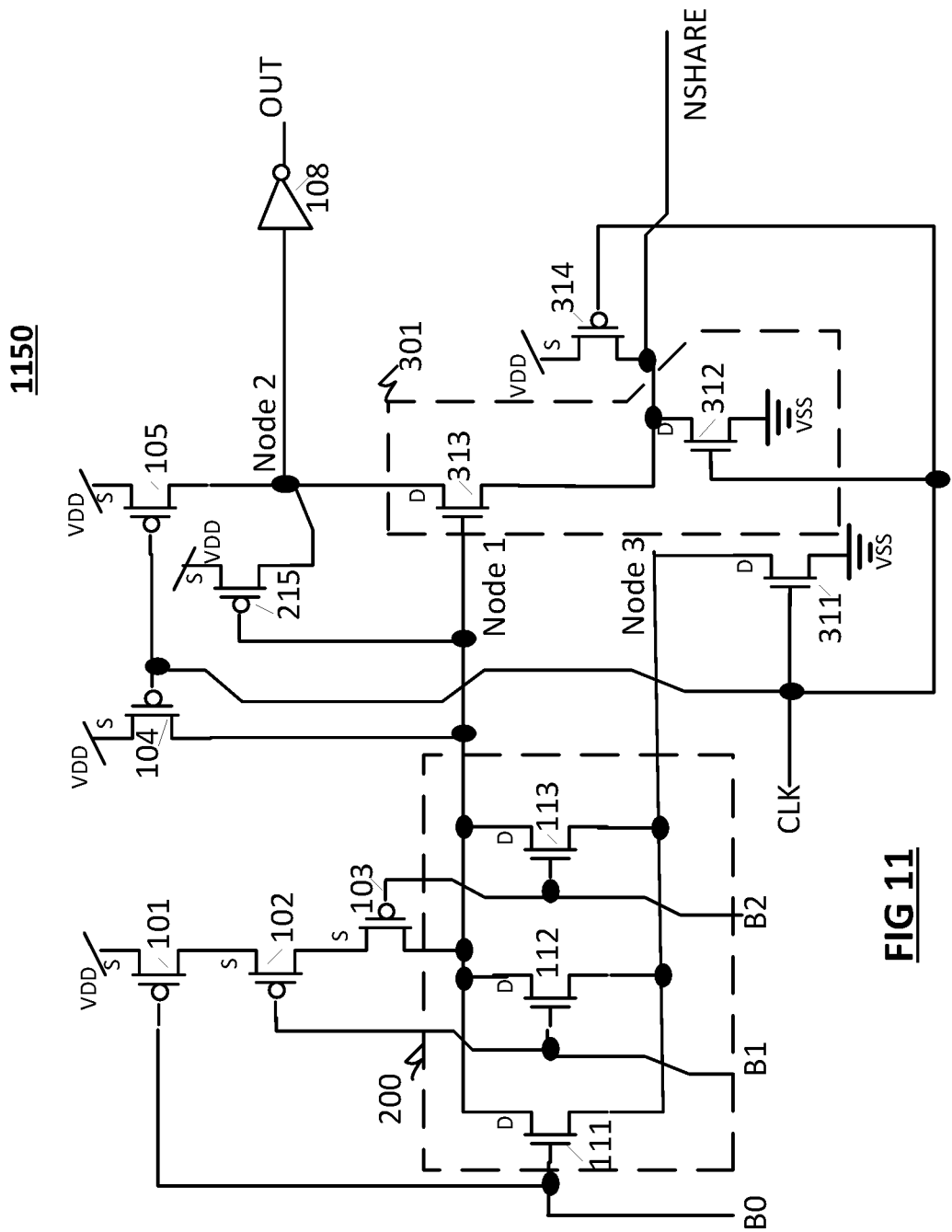
FIG. 11 depicts an example dynamic decode circuit with CLK clock.

In an embodiment the DCLK signal may be a delayed version of the evaluation clock signal CLK as shown in FIG. 10. CLK may be passed through two inverters 901 and 902 to produce the delayed DCLK signal. Other means may be used, for example, CLK may be passed over a delay line (long wire) to produce a DCLK.

FIG. 10 shows the relationship of the example precharge function wherein precharge is delayed for a predetermined period T1-T2. The CLK signal goes high at T0 and goes low at T1. DCLK is depicted as a delayed version of CLK that goes low at T2. The precharge circuits (105 212 for example) causes the respective precharged node (Node 2) to go high at T2 when both CLK and DCLK are low and then low again at T3 when CLK goes high. Of course, in other embodiments, different circuitry may be used to create the precharge function. In an embodiment, CLK is used to clock the nfets and a PCLK is used to clock the precharge pfets. PCLK is created to have the relationship to CLK of the PRECHARGE signal depicted in FIG. 10.

Returning to FIG. 2, in different embodiments, the effective precharge may start before or after CLK, and may have an active period greater or less than CLK. Pfet keeper transistor 215 attempts to hold Node 2 high as long as Node 1 is low. The decoder section 200 may be unchanged from the prior art. The evaluation clocking section 201 is different from the prior art as Node 3 is now precharged via a serial pair of pfet transistors 217 and 218 receiving DCLK and CLK respectively. Furthermore Node 3 may be made available to other circuits as an NSHARE signal to provide the precharged evaluation Node 3 to other circuits.

Figure 3:
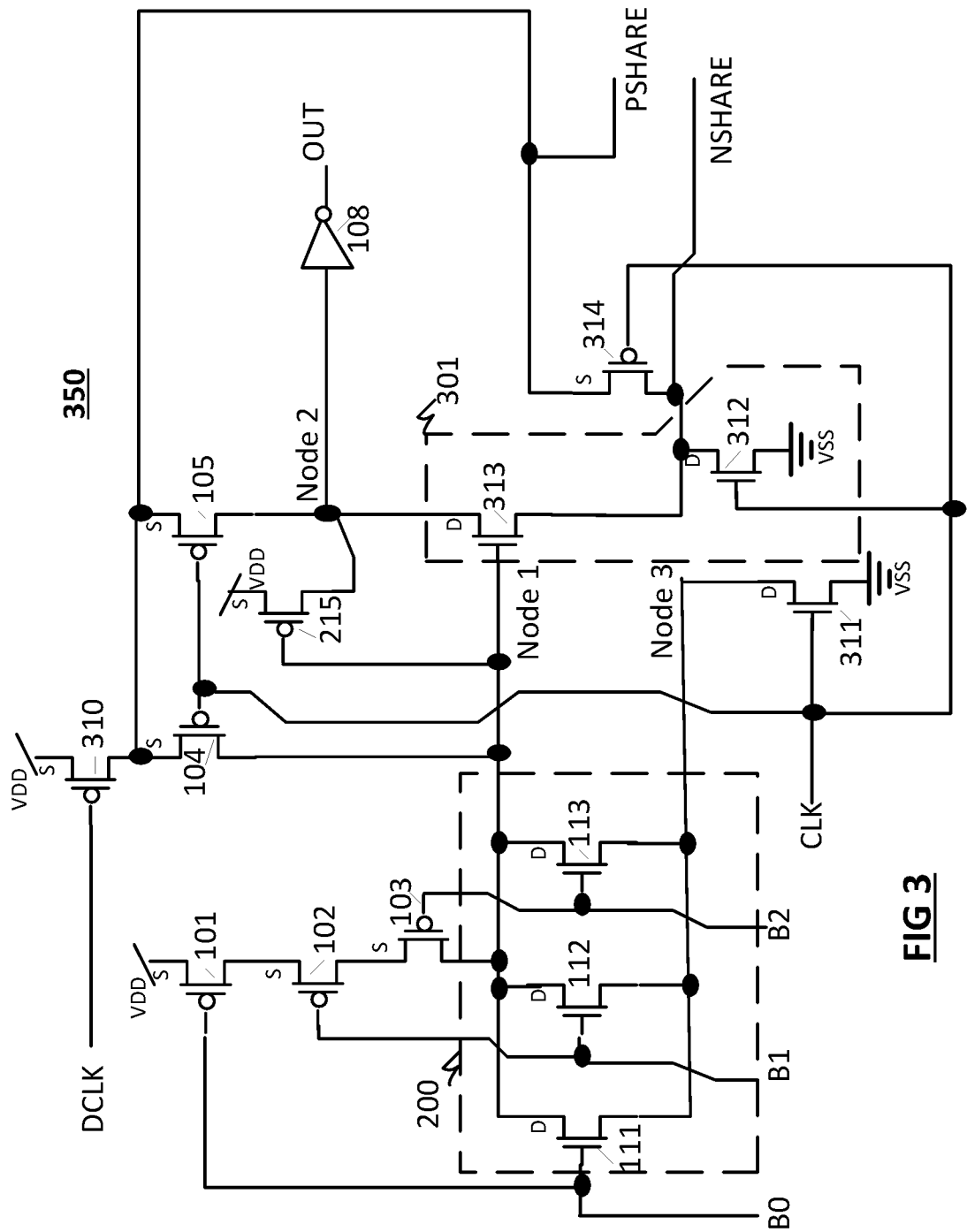
FIG. 3 depicts an example dynamic decode circuit with a DCLK clock and isolated Node 3.

Referring now to FIG. 3, another example embodiment is shown. In this case, a PSHARE node may be created to provide the DCLK function to other circuits. In this implementation, each node to be precharged Node 1, Node 2 and Node 3, has an evaluation clock pfet transistor 104, 105 and 312, but not a pair. Instead each valuation clock pfet transistor source 104 105 and 312 is connected to the drain of a single DCLK pfet transistor 310. Furthermore, in this example, Node 3 is not precharged but may be separately clocked by evaluation nfet transistor 311 and NSHARE may be separately clocked by evaluation nfet transistor 312 in series with nfet transistor 313. In this embodiment, NSHARE is precharged according to the delay described in FIG. 10, but Node 3 is not precharged directly. In an implementation, another node may be precharged, for example Node 3. In another embodiment, another node may perform a SHARE function, for example, Node 3 may be shared by multiple modules 350 to reduce the size of nfet 311.

Referring again to FIG. 2, when the evaluation clock signal (CLK) is in the precharge state (low), the circuit 250 may be in the precharge or restore state. In this state, Node 1, Node 2, Node 3 may be all precharged to high. The DCLK signal may be logically the same as CLK but delayed in time to allow for a wider output pulse to delay the start of precharge. When the CLK signals transitions high or evaluate state, the input signals B0 B1 and B2 will be evaluated. Therefore, if one or more of the input signals B0 B1 B2 goes high, Node 1 will transition to low, thus turning off nfet 214 and Node 2 will maintain its original precharge high voltage state. The transition of Node 1 to low turns on the keeper pfet transistor 215. Thus transistor 215 will maintain the original high voltage state on Node 2. At the end of the operation or cycle, CLK and DCLK will transition back to low and all precharge transistors: 104 105 218, will be in their conduction state with Node 1, Node 2, Node 3 and NSHARE held in the high voltage state. Thus the output signal OUT will maintain a low (not selected) state.

By precharging the NSHARE Node 3 every cycle, the source terminal of nfet 214 transitions to the low state with NSHARE during the evaluation phase when transistor 213 conducts. While at the same time Node 1 will transition to the low during the evaluation phase when any decode transistor 111 112 113 conducts. Therefore the nfet 214 gate-to-source voltage may be kept below the turn on voltage necessary for that device to conduct. This minimizes glitching of Node 2, and allows the arrival of input signals B0 B1 B2 to be coincident to the CLK input without any impact to functionality. Therefore, by precharging the node NSHARE, a built-in delay is provided allowing the input decode stage 200 to evaluate (pull-down) before the nfet evaluation stack 201 consisting of nfet transistor 213 and nfet transistor 214 (connected to Node 2) can conduct thus allowing for a small setup time between the input signals B0 B1 B2 and the evaluation clock signal CLK.

When the evaluation clock signal (CLK) is in the precharge phase (low), the circuit 250 may be in the precharge or restore state according to the precharge start delay previously described. In this state, Node 1, Node 2, Node 3 and NSHARE may be all precharged to the high voltage state. Again, the DCLK signal may be logically the same as evaluation clock signal CLK but delayed in time to allow for a wider output pulse to delay the start of precharge. When the CLK signals transitions to high (or evaluation), the input signals B0 B1 B2 will be evaluated. Therefore, if all input signals B0 B1 B2 are low, Node 1 will maintain its original precharge high voltage state, thus allowing nfet 214 to conduct and Node 2 will transition to low when NSHARE transitions to low. Thus pfet keeper transistor 215 will be in the non-conduction state, so as to allow Node 2 to transition to low and the output signal OUT to transition to high (the selected state). At the end of the operation or cycle, CLK and DCLK will transition back to low and all precharge transistors will be in the conduction state so as to precharge Node 1, Node 2, Node 3 and NSHARE back high. Finally, the output signals OUT will transition back to low when the delay clock DCLK transitions back to low. This delay DCLK action allows for an output OUT pulse width is wider than the CLK pulse width. A keeper function may be provided with pfets 101 102 103 such that with all inputs B0 B1 B2 low, Node 1 may be kept high by the conduction of the 3 serial pfets 101 102 103.

The NSHARE node allows for multiple dynamic decode circuits to share the bottom nfet 213, 312 for larger effective pull-down strength and an overall faster evaluate action of Node 2's transition to the low voltage state. Each dynamic decode circuit has a bottom nfet and conducts in parallel with all other bottom nfets, so the bottom nfets can be significantly smaller in an embodiment where only one of the multiple dynamic decode circuits will be selected by its decode function.

Referring to FIG. 3, a further enhancement may be the addition of the PSHARE node to further reduce the load on the DCLK signal while delivering a larger effective pull-up strength. Also shown is the addition of a separate pull-down nfet 311 for the input NOR circuit. With this approach, NSHARE may be separated from the new Node 3 allowing additional circuit optimization for glitch reduction on Node 2.

NSHARE and PSHARE may be of particular use in logic modules that function mutually exclusively as in an application of decode circuit 350 for example. In that application, the same logic module design may be used repetitively to select, for example, a respective word-line of a randomly accessed memory (RAM). Since only one module 350 can be selected by a particular address (inputs B0 B1 B2), only one module 350 OUT will be activated for any particular address. Thus, the evaluate CLK nfet 312 for each module 350 will operate in parallel, so the nfet 312 can be much smaller. In an example, eight decode modules 350 using NSHARE need only implement nfets 312 ⅛th the size of a module 350 not using NSHARE to achieve the same current capability.

PSHARE similarly shares the precharge pfet 310 amongst multiple modules, thus the pfet 310 can be ⅛th the size of a pfet not using PSHARE.

Not only does PSHARE reduce the physical size of a die used for modules 350, it may also cause the module to be faster than a traditional dynamic logic implementation.

Figure 4:
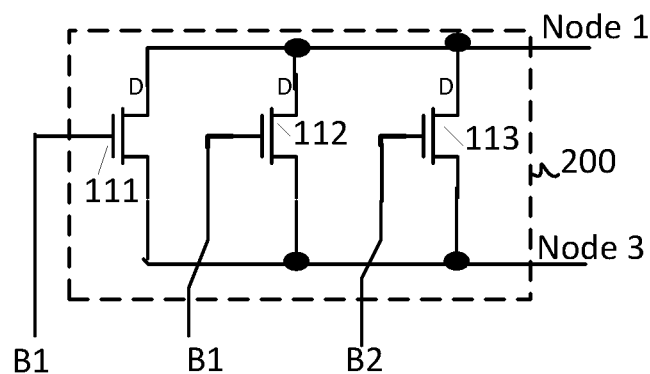
FIG. 4-FIG. 6 depict example decode functions.
Figure 5:
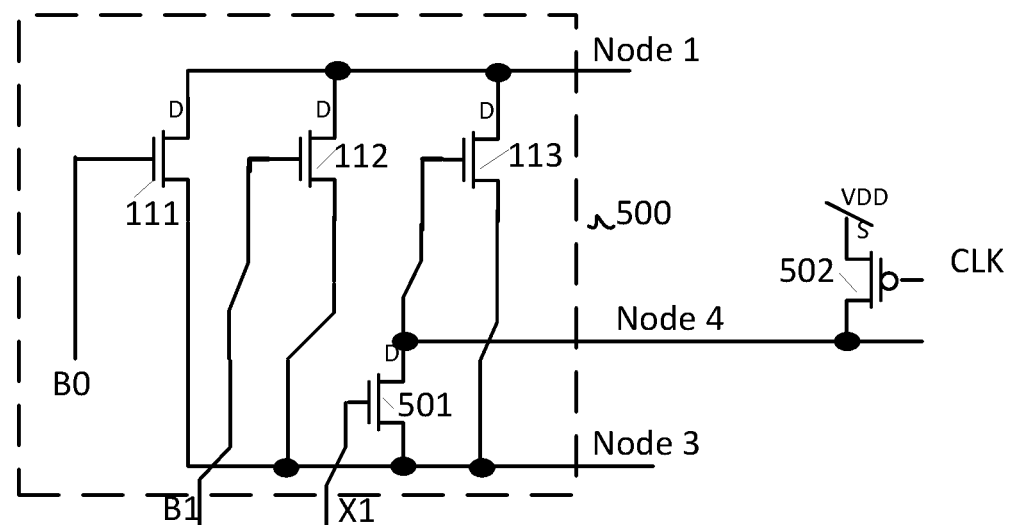
Figure 6:
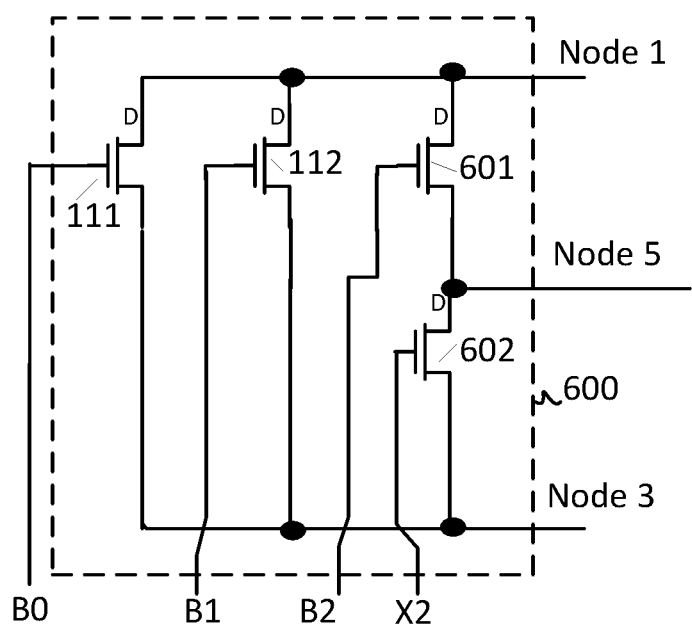

Other embodiments may include other decode circuits other than 200. FIG. 4 depicts a decoder consisting of parallel nfets. FIG. 5 depicts a decoder 500 consisting of another arrangement of nfet transistors. FIG. 6 depicts a decoder consisting of both parallel and serial nfet transistors.

Figure 7:
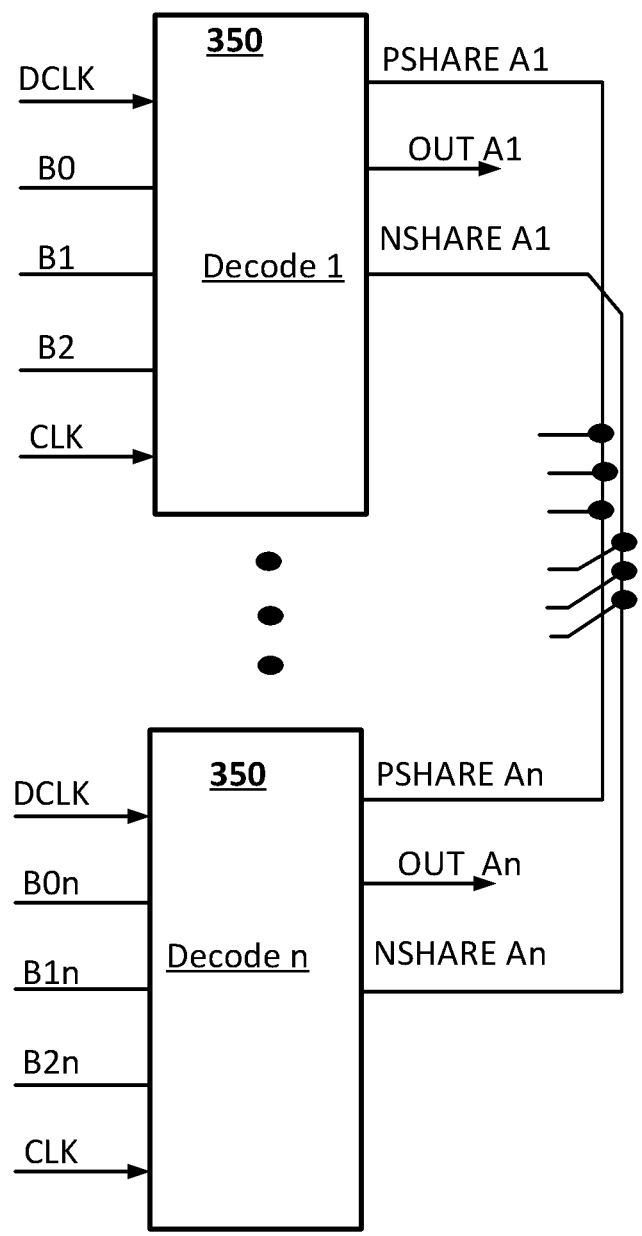
FIG. 7 depicts use of PSHARE and NSHARE.

FIG. 7 depicts an example PSHARE NSHARE embodiment, depicting n modules 350 Decode 1 through Decode n of dynamic decode circuit FIG. 3 for example. Since the decode circuit 200 of each module 350 is decoding a unique function, the decode circuit 200 of only one of the Decode modules can conduct for any particular cycle. One module 350 Decode 1 receives inputs B0 B1 B2 for determining OUT A1, the other module 350 also receives inputs to determine mutually exclusive OUT signals. The nth module is shown Delay n having inputs B0n B1n B2n and producing OUT signal OUT An. All NSHARE A1 through NSHARE An nodes are commonly wired as are all PSHARE A1 through PSHARE An nodes. Therefore current for evaluation is provided by each transistor 312 in parallel although only one Delay module decode is active, therefore each nfet transistor 312 need only handle 1/nth the current and can be much smaller than in prior art. Similarly, each DCLK transistor 310 operating in parallel, only needs to provide current for 1/nth the requirement and only needs to be 1/nth the size of the prior art.

The DCLK pfet 310 may be 1/nth the size of a non PSHARE implementation because the pfets 310 of each module operate in parallel but only one module is selected. Similarly the nfets 312 may be 1/nth the size of non NSHARE implementations because the nfets 312 of each module operate in parallel but only one module is selected.

Figure 8:
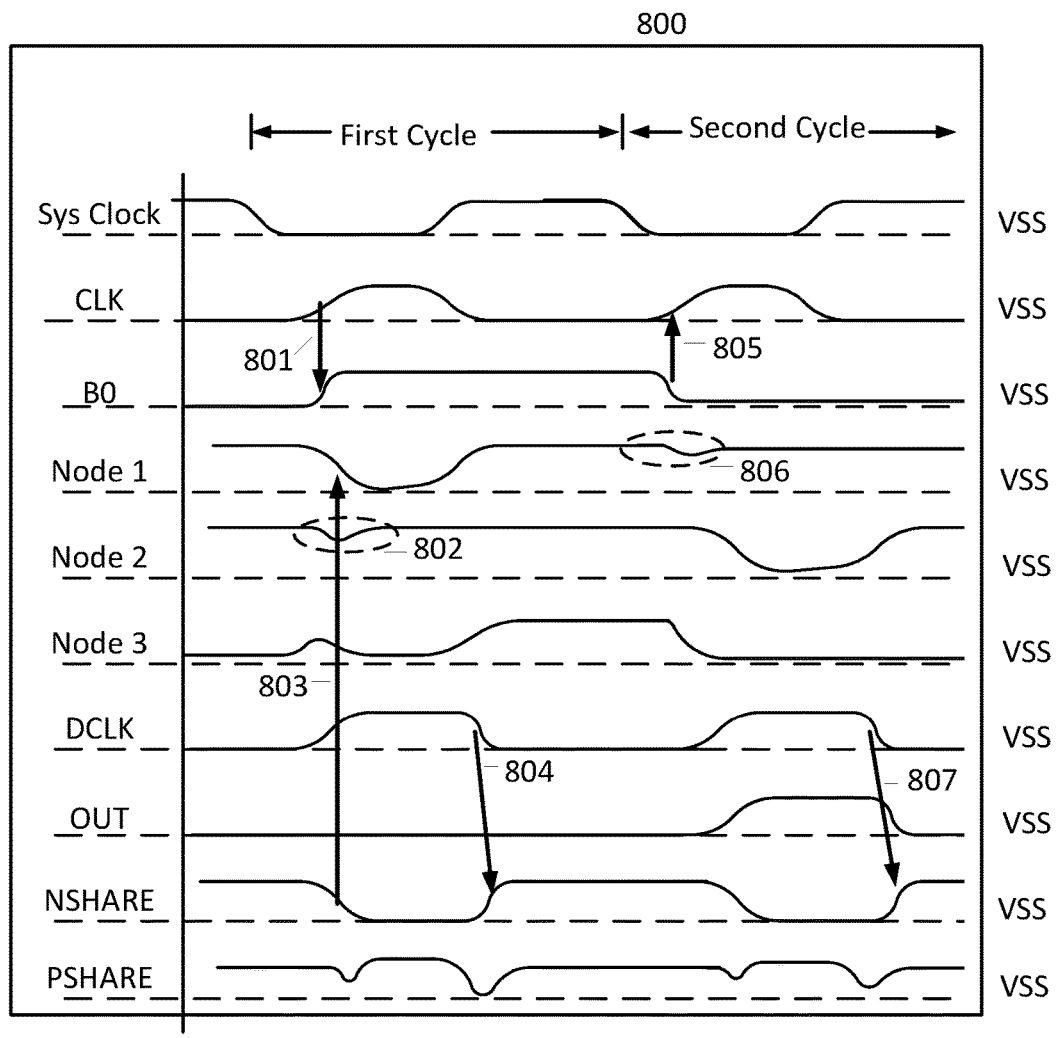
FIG. 8 depicts a timing chart according to an example implementation.

FIG. 8 shows an example voltage waveform 800 of the decode circuits 350 having decoder 200 performing a NOR function. The first cycle may be indicated by the falling edge of system clock. In the first cycle, all inputs stay low except for B0 which transitions high. The evaluation clock "CLK" may be a delayed version of system clock in an embodiment. The first cycle shows 801 the evaluation clock signal "CLK" rising at the same time the input B0 may be rising. This signal relationship shows what may be called a zero setup-time; therefore, with B0 high, the decoder 200 may be in a non-selected state (the NOR function requires all inputs be low), so notice the falling edge of Node 1 turning off the nfet 214 313. Also, there may be a relatively small downward glitch 802 on Node 2 where most of the glitch may be due to the normal capacitive coupling action from the downward movement of Node 1. Also, there may be a downward voltage transition of NSHARE. As mentioned above, the delay 803 of NSHARE vs the falling transition of Node 1 due to the precharging of NSHARE, prevents the nfet 214 from turning on, thus minimizing the glitch seen on Node 2.

The second cycle shown shows the case where all inputs may be at the low state (selected state) except for input B0. In this cycle input B0 transitions 805 from high to low at the same time the input clock CLK transitions to high (to the evaluate clock state). In the fully selected state (all inputs low), Node 2 transitions to low and the output (OUT) transitions to high. Notice here that Node 2 glitches slightly downward 806, but recovers and may be held high by the active pull-up action of the pfet keeper stack 101 102 103. Also notice the falling edge of DCLK 807 which triggers the delayed beginning of the precharge of Node 1, Node 2, NSHARE and PSHARE.

A timing diagram of FIG. 2, where NSHARE may be common with Node 3 would have a different wave form. For an example, Node 3 may be precharged along with NSHARE, so the wave form for Node 3 would go high when DCLK goes low on the second phase.

Various combinations of nfet transistors may be employed to perform decode functions within the scope of embodiments. Other decode functions may include combinations of pfet and nfet transistors. Furthermore these embodiments may advantageously provide internal nodes subject to precharge over and above Node 1 and Node 3. Referring to FIGS. 4, 5 and 6, various example alternatives of input decoders 200 may be depicted. FIG. 4 depicts the NOR gate function as shown in FIG. 1, FIG. 2 and FIG. 3. The function of Node 1 may be not-B0 ($\overline{B0}$) AND not-B1 ($\overline{B1}$) AND not-B2 ($\overline{B2}$). Other decoders may be well known in the art and may employ nfets in various arrangements.

FIG. 5 shows one example decoder circuit 500 which includes nfet transistors 111 112 of FIG. 2, wherein nfet transistor 501 may be an inverter configured to feed the gate of nfet transistor 113 and includes an internal Node 4 connected to the drain of FIG. 501. The function of Node 1 of FIG. 5 may be not-B0 ($\overline{B0}$) AND not-B1 ($\overline{B1}$) AND X1. In this decoder, new nodes may be introduced (Node 4) requiring a precharge function pfet 502.

FIG. 6 depicts example decode circuit 600 that includes nfet transistors 111 and 112 of FIG. 2 and serial transistors 600 601 having an internal Node 5. Input B2 and X2 must both be high in order to pull Node 1 low. The function of decoder 600 may be not-B0 ($\overline{B0}$) AND not-B1 ($\overline{B1}$) AND [not-B2 ($\overline{B2}$) OR not-X2 ($\overline{X2}$)].

Referring to FIGS. 1, 2 and 3, in an embodiment, a dynamic decode circuit 250 350 is provided for decoding a plurality of input signals B0 B1 B2, the dynamic decode circuit 250 350 comprising: a decoder 200 comprising a plurality of decode transistors FIGS. 4, 5, 6, the decode transistors are configured to cause a first node Node 1 to be in a first state based on the input signals B0 B1 B2 being in a first input signal state and an evaluation clock signal being active; the decode transistors are configured to cause the first node Node 1 to be in a second state based on the input signals B0 B1 B2 being in a second input signal state other than the first input signal state and the evaluation clock signal CLK being active; an evaluate clock circuit 201 301 is conductively connected between a first power source VSS and a second node Node 2, the evaluate clock circuit comprising a first transistor 110 213 312 and a second transistor 109 214 313, the first transistor 110 213 312 is serially connected by a first interconnecting node NSHARE to the second transistor 109 214 313, the first transistor 110 213 312 comprising a first gate configured to receive the evaluation clock signal, the first transistor 110 213 312 is configured to conduct based on the evaluation clock signal being active, the second transistor 109 214 313 comprising a second gate conductively connected to the first node Node 1, the first transistor is configured to not conduct based on the evaluation clock signal being inactive; and one or more precharge circuits conductively connected to a second power source, the one or more precharge circuits are configured to precharge the first node Node 1 and the second node Node 2 and the first interconnecting node NSHARE based on the evaluation clock signal CLK being inactive, the precharge circuits configured to not conduct based on the evaluation clock signal CLK being active.

Precharge circuits may comprise transistors 104, 105, 218, 314. One or more of the precharge circuits may be a delay precharge circuit 220, each delay precharge circuit further comprising a serially connected transistor for receiving a delayed evaluation clock (DCLK) for example in FIG. 2. Transistor pairs may be discrete pairs as shown in FIG. 2 104 211, 105 212, 218 217, or may employ a shared transistor 310 as shown in FIG. 3 to provide the pairs 104 310, 105 310 314 310.

In an embodiment, at least one of the precharge circuits is a delay precharge circuit, the delay precharge circuit configured to delay start of precharge by a predetermined delay following the evaluation clock becoming inactive.

In an embodiment, the precharge circuit configured to precharge the first interconnecting node is a delay precharge circuit.

In an embodiment, the delay precharge circuit comprises a third transistor 104 105 218 104 105 or 314 serially connected by a second connection to a fourth transistor 211 212 217, 310, the third transistor having a third gate configured to receive the evaluation clock signal CLK, the fourth transistor having a fourth gate configured to receive a delay clock signal. DCLK the delay clock signal is a delayed version of the evaluation clock signal CLK.

In an embodiment, the dynamic decode circuit further comprises a serially connected plurality of fifth transistors 101 102 103, the plurality of fifth transistors disposed between the second power source VDD and the first node Node 1, the plurality of fifth transistors each configured to receive a respective one of the plurality of input signals B0 B1 B2, the plurality of fifth transistors 101 102 103 configured to keep the first node in the precharge state based on the input signals B0 B1 B2 being in the first state.

In an embodiment, the dynamic decode circuit further comprises: a sixth transistor 215 coupled between the second node Node 2 and the second power source VDD, the sixth transistor 215 comprising a sixth gate coupled to the first node Node 1, the sixth transistor configured to keep the second node in the precharge state based on the first node being in the state other than the precharge state.

In an embodiment, the plurality of decode transistors 111 112 113 are conductively connected in parallel with one another.

In an embodiment, the decoder further comprises a third node Node 3, the third node interconnecting the plurality of decode transistors to a clocking transistor 110 213, 311, the clocking transistor conductively connected to the first power source VSS, the clocking transistor having a clocking gate configured to receive the evaluation clock signal CLK.

In an embodiment, the clocking transistor FIG. 2 110 213 is the first transistor, and the third node Node 3 is conductively connected to the first interconnecting node NSHARE.

In an embodiment, the precharge circuits configured to precharge the first node Node 1 and the second node Node 2 and first interconnecting node are delay precharge circuits, each delay precharge circuit consisting comprising a third transistor 104 105 218, 104 105 or 314 serially connected by a respective second connection to a fourth transistor 211 212 217, 310, the third transistor having a third gate configured to receive the evaluation clock signal CLK, the fourth transistor having a fourth gate configured to receive a delay clock signal DCLK, the delay clock signal being a delayed version of the evaluation clock signal CLK.

In an embodiment, the one or more precharge circuits comprise a first precharge circuit and a second precharge circuit, the first precharge circuit configured to precharge the first node Node 1 consists of a sixth transistor 104 and the second precharge circuit configured to precharge the second node Node 2 consists of a seventh 105 transistor, the sixth transistor having a sixth gate configured to receive the evaluation clock signal CLK, the seventh transistor having a seventh gate configured to receive the evaluation clock signal CLK.

In an embodiment, the fourth transistor 310 of the dynamic decode circuit is conductively connected by the second interconnection PSHARE to fourth transistors of a plurality of other dynamic decode circuits, whereby all fourth transistors of all dynamic decode circuits are conductively connected in parallel between the second power source VDD and the second interconnection PSHARE.

In an embodiment the first transistor 213, 312 of the dynamic decode circuit is conductively connected by the first interconnection NSHARE to first transistors of a plurality of other dynamic decode circuits, whereby all first transistors of all dynamic decode circuits are conductively connected in parallel between the first power source and the first interconnection NSHARE.

In an embodiment, a dynamic decode circuit 250, 350 is provided comprising: an evaluation clock circuit 201, 301 comprising a pair of nfet transistors consisting of a first nfet transistor 110, 213, 312 serially connected at a first interconnection node NSHARE to a second nfet transistor 109, 214, 313, the first nfet transistor having a gate configured to receive an evaluation clock signal CLK, the second nfet transistor having a gate conductively connected to a first node Node 1, the pair of nfet transistors conductively connected between a first power source VSS and a second node Node 2; a decode circuit 200 comprising a plurality of third nfet transistors 111 112 113 conductively connected in parallel between the first node Node 1 and a third node Node 3, each third nfet transistor having a gate configured to receive a respective input signal of a plurality of input signals B0 B1 B2, the third node conductively connected to the first power source VSS through a fourth nfet transistor 211, 312, the fourth nfet transistor having a gate configured to receive the evaluation clock signal CLK, the third nfet transistors are configured to cause the first node to transition to a result value based on state of the plurality of input signals B0 B1 B2 and based on the evaluation clock signal CLK being high; a precharge circuit consisting of a pair of pfet transistors consisting of a fifth pfet transistor 218, 314 serially connected at a second interconnection node PSHARE to a sixth pfet transistor 217, 310, the fifth pfet transistor having a gate configured to receive a delayed evaluation clock signal DCLK, the sixth pfet transistor having a gate configured to receive the evaluation clock signal CLK, the pair of pfet transistors disposed between a second power source VDD and the first interconnection node PSHARE, the pair of pfet transistors configured to cause the first interconnection node to be precharged high based on both the delayed evaluation signal DCLK being low and the evaluation clock signal CLK being low; and a keeper circuit comprising a seventh pfet transistor 215 conductively connected between the second power source VDD and the second node Node 2, the seventh pfet transistor having a gate conductively connected to the first node Node 1, the seventh pfet transistor configured to keep the second node high based on the first node being low.

In an embodiment, a dynamic decode circuit 250 350 for decoding a plurality of input signals B0 B1 B2, comprises: a decoder 200 comprising a plurality of decode transistors FIGS. 4, 5, 6, the decode transistors configured to cause a first node Node 1 to be in a first state based on the input signals B0 B1 B2 being in a first input signal state and an evaluation clock signal CLK being active; the decode transistors configured to cause the first node Node 1 to be in a second state based on the input signals B0 B1 B2 being in a second input signal state other than the first input signal state and the evaluation clock signal CLK being active; an evaluate clock circuit 201 301 conductively connected between a first power source VSS and a second node Node 2, the evaluate clock circuit consisting of a first transistor 213 312 and a second transistor 214 313, the first transistor 213 312 serially connected to the second transistor 214 313, the first transistor 213 312 comprising a first gate configured to receive the evaluation clock signal CLK, the first transistor 213 312 configured to conduct based on the evaluation clock signal being active, the second transistor 214 313 comprising a second gate conductively connected to the first node Node 1, the first transistor configured to not conduct based on the evaluation clock signal being inactive; and one or more delay precharge circuits 104 211, 105 212, 104 310, 105 310 conductively connected to a second power source VDD, the one or more delay precharge circuits configured to precharge the first node Node 1 and the second node Node 2 based on the evaluation clock signal CLK being inactive, the one or more delay precharge circuits configured to not conduct based on the evaluation clock signal CLK being active, the delay precharge circuit configured to delay start of precharge by a predetermined delay following the evaluation clock signal CLK becoming inactive FIG. 10.

Figure 9:
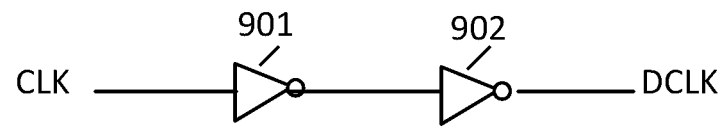
FIG. 9 depicts an example circuit for creating a DCLK.

In an embodiment, the dynamic decode circuit further comprises a delay precharge clocking circuit FIG. 9 configured to create a clock signal CLK at a clock signal node and a delayed clock signal DCLK at a delayed clock signal node, wherein the delay precharge circuit consists of a pair of serially connected delay precharge transistors consisting of a first precharge transistor 104 105 and a second precharge transistor 211 212 310, the first precharge transistor 104 105 having a first precharge gate conductively connected to the clock signal node CLK, the second precharge transistor 211 212 310 having a second precharge gate conductively connected to the delayed clock signal node DCLK.

In an embodiment, the delay precharge clocking circuit FIG. 9 comprises a plurality of inverters 901 902 disposed between the clock signal node CLK and the delayed clock signal node DCLK, the plurality of inverters 901 902 receiving the clock signal CLK at the clock signal node CLK and outputting the delay clock signal DCLK at the delayed clock signal node DCLK.

In an embodiment, a plurality "n" of dynamic decode circuits Decode 1 through Decode n is provided, as shown in FIG. 7, each dynamic decode circuit comprising a decoder 200 configured to decode a corresponding plurality of input signals B0x B1x B2x, each dynamic decode circuit Decode 1 through Decode n further comprises a conditioning transistor 101 102 310 104 105 314 312 311 configured to condition a conditioned node Node 1, Node 2, Node 3, PSHARE or NSHARE of the dynamic decode circuit, the conditioning transistor having a gate conductively connected to a clock signal CLK or DCLK, the conditioning transistor conductively connected between the conditioned node and a power source VSS VDD, each conditioning transistor of each dynamic decode circuit conductively connected in parallel between the power source and interconnected conditioned nodes NSHARE PSHARE of the plurality of dynamic decode circuits Decode 1 through Decode n.

Referring to FIG. 3, example conditioning transistor 312 conditions the NSHARE node during the evaluate phase of the clock CLK, conditioning transistors 310 314 in combination condition the NSHARE node during the precharge phase of the CLK, and conditioning transistor 310 conditions the PSHARE node during the precharge phase of the clock CLK. Furthermore, conditioning transistors 310 104, in combination condition Node 1 during the precharge phase of the clock CLK, conditioning transistor 311 conditions Node 3 during the evaluate phase of the clock CLK and conditioning transistors 310 105 in combination condition Node 2 during the precharge phase of the clock CLK. Although only PSHARE and NSHARE are shown, any conditioned node may be a candidate for an interconnected condition node of a plurality of dynamic decode circuit modules in order to reduce the size of the conditioning transistor(s), as they will share responsibility for providing current to only the subset (one) of the dynamic decode circuits that can conduct in any single clock CLK cycle.

Referring to FIG. 2, example conditioning transistor 213 conditions the NSHARE node during the evaluate phase of the clock CLK, conditioning transistors 217 218 in combination condition the NSHARE node during the precharge phase of the CLK, and conditioning transistor 312 conditions the PSHARE node during the precharge phase of the clock CLK. Furthermore, conditioning transistors 211 104, in combination condition Node 1 during the precharge phase of the clock CLK, conditioning transistors 217 218 in combination condition Node 3 during the evaluate phase of the clock CLK, and conditioning transistors 212 105 in combination condition Node 2 during the precharge phase of the clock CLK.

Precharging conditioning circuits may conduct little or no current when the previous evaluate phase did not transition the node from the precharged state for example. In embodiments, only a maximum predetermined number of modules can transition the output OUT active (high) in a clock CLK cycle for any combination of inputs as only one the maximum number (one) of decoders will conduct. In an embodiment, the maximum predetermined number of modules is a single module. Since only the maximum predetermined number of modules can transition the output OUT high, the respective conditioning transistor can be made smaller because the current provided by the parallel conditioning transistors of the modules is provided by the combined conditioning transistors sharing the respective conditioned node. For the case where the maximum predetermined number is x and the number of modules is n, the size of each conditioning transistor can be x/n relative to the conditioning transistor of the prior art, where the conditioning transistor is designed to conduct the current of a single, stand-alone module.

In an embodiment, the conditioning transistor comprises a first precharge pfet transistor 310 314 configured to precharge the conditioned node PSHARE NSHARE of the dynamic decode circuit 350, the plurality of dynamic decode circuits Decode 1 through Decode n sharing drains of respective first precharge pfet transistors 310 314.

In an embodiment, the conditioning transistor consists of an nfet evaluate transistor 312 configured to evaluate function of the dynamic decode circuit 350, the plurality of dynamic decode circuits sharing drains of respective evaluate transistors 312.

In an embodiment, the conditioning transistor comprises two serially connected transistors 310 314 consisting of the first precharge pfet transistor 314 having a first gate configured to receive an evaluation clock signal CLK and a second precharge pfet transistor 310 having a second gate configured to receive a delayed evaluation clock signal DCLK.

In an embodiment, the plurality of dynamic decode circuits Decode 1 through Decode n are configured, based on the state of the input signals B0x B1x B2x, to enable a decoder 200 of only a predetermined maximum number of dynamic decode circuits x of the plurality n of dynamic decode circuits to conduct in any clock cycle, wherein size of the conditioning transistor 310 314 312 is based on a ratio of the predetermined maximum number to a total number of dynamic decode circuits.

In an embodiment, the predetermined maximum number is one.

One skilled in the art will appreciate that serially connected transistors may be serially connected in any order, for example, evaluation clocking sections 201 clocked transistor 213 could be connected to Node 2, and transistor 214 could be connected to VSS without departing from the teaching. Furthermore, the transistors receiving DCLK 211 212 217 could be serially connected to respective transistors 104 105 218 such that the transistors receiving CLK are connected to VDD, and the transistors receiving CLK are connected to respective nodes Node 1 Node 2 NSHARE. Furthermore in embodiments, nodes other than PSHARE and NSHARE may be shared between a plurality of dynamic decode circuits in order to reduce the size of transistors sharing current. For example, Node 3 could be shared in order to reduce the size of shared evaluation clocking transistor 311.

Although embodiments have been described with reference to a specific embodiment, further modifications and improvements will occur to those skilled in the art. For instance, the transistors may be implemented either as n-channel or p-channel devices as desired. These substitutions, and the requisite changes caused by them, will be obvious to one skilled in the art. It may be to be understood therefore, that the invention encompasses all such modifications that do not depart from the spirit and scope of the invention as defined in the appended claims. Also, the designation of portions of the various transistors described above as "drain" or "source" may be merely semantic given the bidirectional nature of CMOS circuits and may be arbitrary given the other semiconductor media in which the disclosed invention may be practiced. Embodiments disclosed use p-channel (pfet) transistors to precharge nodes as pfet in many technologies may be slower than nfet. Nfet may be shown as evaluate transistors as they may be faster. Given the teaching of the present invention, it would be obvious to one of average skill in the art to utilize nfet for precharge and pfet for evaluate functionality, or combinations thereof as desired. The claims therefore may describe power supplies generically for example as first power source and second power source, and the drain, source, and gate generically for example as a first current electrode, a second current electrode and a control electrode, respectively.

What is claimed is:

1. A method for conditioning a shared node of a plurality of dynamic decode circuits, each dynamic decode circuit having a decoder, an output transistor and a conditioning transistor, each conditioning transistor of the plurality of dynamic decode circuits connected in parallel between a common power source and the shared node, the each dynamic decode circuit performing, the method comprising:
    receiving input signals, by a plurality of inputs of the decoder;
    precharging a first node of the decoder to a high state, by a first precharge circuit comprising a first precharge transistor, based on being in a precharge phase of an evaluation clock, the first node being conductively connected to a gate of the output transistor;
    precharging a second node of the output transistor to the high state, by a second precharge circuit comprising a second precharge transistor, based on being in the precharge phase of the evaluation clock, the output transistor being disposed between the second node and an interconnecting node;
    pulling a third node of the decoder to a low state, by an evaluate transistor, based on being in an evaluation phase of the evaluation clock;
    pulling the interconnecting node of the output transistor to the low state, by the evaluate transistor, based on being in the evaluation phase of the evaluation clock, wherein the third node and the interconnecting node of the decoder are pulled to the low state, by the evaluate transistor, based on being in the evaluation phase of the evaluation clock;
    based on the plurality of inputs being in a predetermined state, causing the first node to be in the high state; and
    based on the plurality of inputs not being in the predetermined state, causing the first node to be in the low state;
    based on the first node being in the high state during the evaluation phase of the evaluation clock, causing the second node of the output transistor to be in the low state; and
    based on the first node being in the low state during the evaluation phase of the evaluation clock, causing the second node of the output transistor to be in the high state; and
    causing, by the conditioning transistor, the shared node to be in a conditioned state, wherein the conditioning transistor consists of any one of a precharge transistor of the precharge circuit and the evaluation transistor.

2. The method according to claim 1, further comprising: precharging interconnecting node of the output transistor to the high state, by a third precharge circuit comprising a third precharge transistor, based on being in a precharge phase of the evaluation clock.

3. The method according to claim 1, wherein at least one of the precharge circuits consist of two serially connected precharge transistors, further comprising delaying start of the precharge to the high state based on a delay precharge transistor of the precharge circuit receiving a delayed evaluation clock.

4. The method according to claim 3, further comprising: creating the delayed evaluation clock from the evaluation clock; and receiving the delayed evaluation clock by a gate of the delay precharge transistor.

5. The method according to claim 1, wherein only a predetermined maximum number of decoders of the plurality of dynamic decode circuits can have the same predetermined state, wherein size of the conditioning transistor is determined by a ratio of the predetermined maximum number to a total number of dynamic decode circuits.

6. The method according to claim 5, wherein the predetermined maximum number is 1.

7. The method according to claim 1, further comprising: precharging a respective node by a respective precharge circuit based on the evaluation clock being low; and not precharging the respective node by the respective precharge circuit based on the evaluation clock being high.

8. The method according to claim 1, wherein the each dynamic decode circuit is one of N dynamic decode circuits having the shared node shared by the N dynamic decode circuits, the method further comprising:
    providing, by the conditioning transistor of the each dynamic decode circuit of the plurality of dynamic decode circuits, 1/N of the current to the shared node needed to precharge the shared node, wherein the each conditioning transistor is a reduced size transistor designed to provide the 1/N of the current.

9. The method according to claim 1, wherein the dynamic decode circuit is one of N dynamic decode circuits having the shared node shared by the N dynamic decode circuits, the method further comprising:
    providing, by the conditioning transistor of the each dynamic decode circuit of the plurality of dynamic decode circuits, 1/N of the current to the shared node needed to evaluate the shared node, wherein the each conditioning transistor is a reduced size transistor designed to provide the 1/N of the current.

10. The method according to claim 1, wherein only a predetermined maximum number of decoders of the plurality of dynamic decode circuits can have the same predetermined state, wherein size of the conditioning transistor is determined by a ratio of the predetermined maximum number to a total number of dynamic decode circuits.

11. The method according to claim 10, wherein the predetermined maximum number is 1.

12. A method for conditioning a shared node of a plurality of dynamic decode circuits, each dynamic decode circuit having a decoder, an output transistor and a conditioning transistor, each conditioning transistor of the plurality of dynamic decode circuits connected in parallel between a common power source and the shared node, the each dynamic decode circuit performing the method comprising:

receiving input signals, by a plurality of inputs of the decoder;

precharging a first node of the decoder to a high state, by a first precharge circuit comprising a first precharge transistor, based on being in a precharge phase of an evaluation clock, the first node being conductively connected to a gate of the output transistor;

precharging a second node of the output transistor to the high state, by a second precharge circuit comprising a second precharge transistor, based on being in the precharge phase of the evaluation clock, the output transistor being disposed between the second node and an interconnecting node;

pulling a third node of the decoder to a low state, by a first evaluate transistor, based on being in an evaluation phase of the evaluation clock;

pulling the interconnecting node of the output transistor to the low state, by a second evaluate transistor, based on being in the evaluation phase of the evaluation clock;

based on the plurality of inputs being in a predetermined state, causing the first node to be in the high state; and based on the plurality of inputs not being in the predetermined state, causing the first node to be in the low state;

based on the first node being in the high state during the evaluation phase of the evaluation clock, causing the second node of the output transistor to be in the low state; and based on the first node being in the low state during the evaluation phase of the evaluation clock, causing the second node of the output transistor to be in the high state; and causing, by the conditioning transistor, the shared node to be in a conditioned state, wherein the conditioning transistor consists of a precharge transistor of the precharge circuit.

13. The method according to claim 12, wherein the first evaluate transistor and the second evaluate transistor are a separate evaluate transistor, the third node and the interconnecting node of the decoder are pulled to the low state, by the separate evaluate transistor, based on being in the evaluation phase of the evaluation clock.

14. The method according to claim 12, further comprising:

precharging the interconnecting node of the output transistor to the high state, by a third precharge circuit comprising a third precharge transistor, based on being in a precharge phase of the evaluation clock.

15. The method according to claim 12, wherein at least one of the precharge circuits consist of two serially connected precharge transistors, further comprising delaying start of the precharge to the high state based on a delay precharge transistor of the precharge circuit receiving a delayed evaluation clock.

16. The method according to claim 15, further comprising:

creating the delayed evaluation clock from the evaluation clock; and receiving the delayed evaluation clock by a gate of the delay precharge transistor.

17. The method according to claim 12, further comprising:

precharging a respective node by a respective precharge circuit based on the evaluation clock being low; and not precharging the respective node by the respective precharge circuit based on the evaluation clock being high.

18. The method according to claim 12, wherein the each dynamic decode circuit is one of N dynamic decode circuits having a shared node shared by the N dynamic decode circuits, the method further comprising:

providing, by the conditioning transistor of the each dynamic decode circuit of the plurality of dynamic decode circuits, 1/N of the current to the shared node needed to precharge the shared node, wherein the each conditioning transistor is a reduced size transistor designed to provide the 1/N of the current.

19. The method according to claim 12, wherein the dynamic decode circuit is one of N dynamic decode circuits having a shared node shared by the N dynamic decode circuits, the method further comprising:

providing, by the conditioning transistor of the each dynamic decode circuit of the plurality of dynamic decode circuits, 1/N of the current to the shared node needed to evaluate the shared node, wherein the each conditioning transistor is a reduced size transistor designed to provide the 1/N of the current.

* * * * *